United States Patent
Hoyt et al.

(10) Patent No.: US 11,402,241 B2
(45) Date of Patent: Aug. 2, 2022

(54) SYSTEMS AND METHODS FOR AN INTEGRATED OPTICAL ATOMIC SENSOR

(71) Applicant: Honeywell International Inc., Morris Plains, NJ (US)

(72) Inventors: Chad Hoyt, Roseville, MN (US); Chad Fertig, Bloomington, MN (US)

(73) Assignee: Honeywell International Inc., Charlotte, NC (US)

( * ) Notice: Subject to any disclaimer, the term of this patent is extended or adjusted under 35 U.S.C. 154(b) by 551 days.

(21) Appl. No.: 16/431,360

(22) Filed: Jun. 4, 2019

(65) Prior Publication Data

US 2020/0386581 A1    Dec. 10, 2020

(51) Int. Cl.
*G01D 5/353* (2006.01)
*G02B 6/42* (2006.01)
(Continued)

(52) U.S. Cl.
CPC ......... *G01D 5/35332* (2013.01); *G02B 6/425* (2013.01); *G02B 6/4206* (2013.01); *G02B 6/43* (2013.01); *G01C 19/58* (2013.01); *G04F 5/14* (2013.01); *H03L 7/26* (2013.01)

(58) Field of Classification Search
CPC .. H03L 7/26; G04F 5/14; G01C 19/58; G02B 6/42; G02B 6/43; G02B 6/4249;
(Continued)

(56) References Cited

U.S. PATENT DOCUMENTS 7,102,451 B2    9/2006  Happer et al.
10,278,275 B2*  4/2019  Imhof ................... G21K 1/006
(Continued)

FOREIGN PATENT DOCUMENTS

CN    104330590 A    2/2015
EP    2685460 B1    7/2017

OTHER PUBLICATIONS

Burke, "Atomic-Photonic Integration (A-PhI) A-[Phi] Proposers' Day", Microsystems Technology Office (MTO), Aug. 1, 2018, pp. 1 through 18, DARPA.
(Continued)

*Primary Examiner* — John R Lee
(74) *Attorney, Agent, or Firm* — Fogg & Powers LLC

(57) ABSTRACT

Systems and methods for an integrated optical atomic sensor are provided. In one embodiment, an optical atomic sensor comprises: first and second photonic integrated circuits and an atom trapping chamber positioned between and bonded to the photonic integrated circuits with the integrated circuits aligned parallel to each other; and atomic vapor sealed within the chamber; wherein the first and second photonic integrated circuits each comprise: a plurality of grating emitters fabricated into respective surfaces of the first and second photonic integrated circuits waveguides configured to couple laser light from laser light sources to the grating emitters; wherein at least one set of the grating emitters are arranged to launch laser light beams into the chamber in a pattern structured to cool the vapor and produce at least one atom trap; wherein the grating emitters further include at least one grating emitter configured to emit a laser light probe into vapor.

20 Claims, 7 Drawing Sheets

(51) Int. Cl.
*G02B 6/43* (2006.01)
*G01C 19/58* (2006.01)
*G04F 5/14* (2006.01)
*H03L 7/26* (2006.01)

(58) Field of Classification Search
CPC .... G02B 6/425; G02B 6/4204; G02B 6/4206; G01D 5/38; G01D 5/3533
See application file for complete search history.

(56) References Cited

U.S. PATENT DOCUMENTS

| | | | | |
|---|---|---|---|---|
| 10,423,124 | B2* | 9/2019 | Gallinet | H03L 7/26 |
| 10,436,811 | B2* | 10/2019 | Dupont-Nivet | G01P 15/08 |
| 2017/0146958 | A1* | 5/2017 | Gallinet | H03L 7/26 |
| 2017/0359888 | A1* | 12/2017 | Imhof | G21K 1/006 |
| 2018/0066942 | A1 | 3/2018 | Compton | |
| 2019/0200445 | A1* | 6/2019 | Imhof | G02B 27/4233 |
| 2020/0120785 | A1* | 4/2020 | Eckel | G21K 1/006 |
| 2020/0386581 | A1* | 12/2020 | Hoyt | G02B 6/4206 |

OTHER PUBLICATIONS

Chauhan et al., "Photonic Integrated Si3N4 Ultra-Large-Area Grating Waveguide MOT Interface for 3D Atomic Clock Laser Cooling", CLEO 2019, pp. 1 through 2, OSA 2019.

European Patent Office, "Extended European Search Report from EP Application No. 20177276.1", from Foreign Counterpart to U.S. Appl. No. 16/431,360, filed Oct. 8, 2020, pp. 1 through 10, Published: EP.

Kim et al., "Photonic waveguide mode to free-space Gaussian beam extreme mode converter", Cornell University Library, Mar. 6, 2018, pp. 1 through 11.

Newman et al., "Photonic integration of an optical atomic clock", Nov. 1, 2018, pp. 1 through 11, https://arxiv.org/ftp/arxiv/papers/1811/1811.00616.pdf.

Ritter et al., "Atomic vapor spectroscopy in integrated photonic structures", Applied Physics Letters 107, 041101, 2015, pp. 1 through 5, AIP Publishing LLC.

Fang et al., "Advances in Atomic Gyroscopes: A View from Inertial Navigation Applications", Sensors, May 11, 2012, pp. 6331-6346.

Hummon et al., "Photonic chip for laser stabilization to an atomic vapor with 10-11 instability", Optica, Apr. 2018, pp. 443-449, vol. 5, No. 4, Optical Society of America.

Kitching et al., "Atomic Sensors—A Review", IEEE Sensors Journal, Sep. 2011, pp. 1749-1758, vol. 11, No. 9, IEEE.

Ludlow et al., "Optical atomic clocks", Reviews of Modern Physics, Apr.-Jun. 2015, vol. 87, America Physical Society.

Mann, "Amazingly precise optical atomic clocks are more than timekeepers", Core Concepts, Jul. 17, 2018, pp. 7449-7451, vol. 115, No. 29, PNAS.

Marti et al., "Imaging Optical Frequencies with 100 uHz Precision and 1.1 um Resolution", Physical Review Letters, Mar. 5, 2018, pp. 1-6, American Physical Society.

* cited by examiner

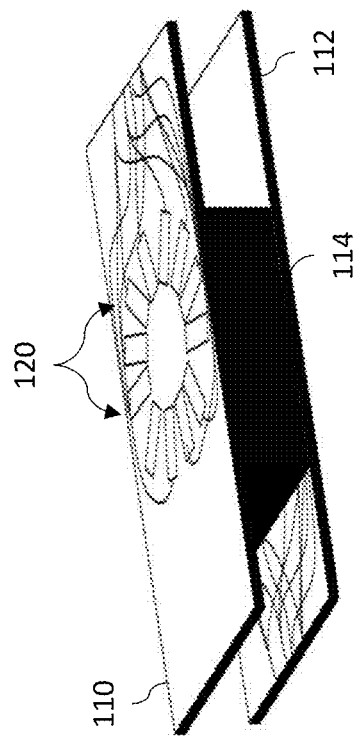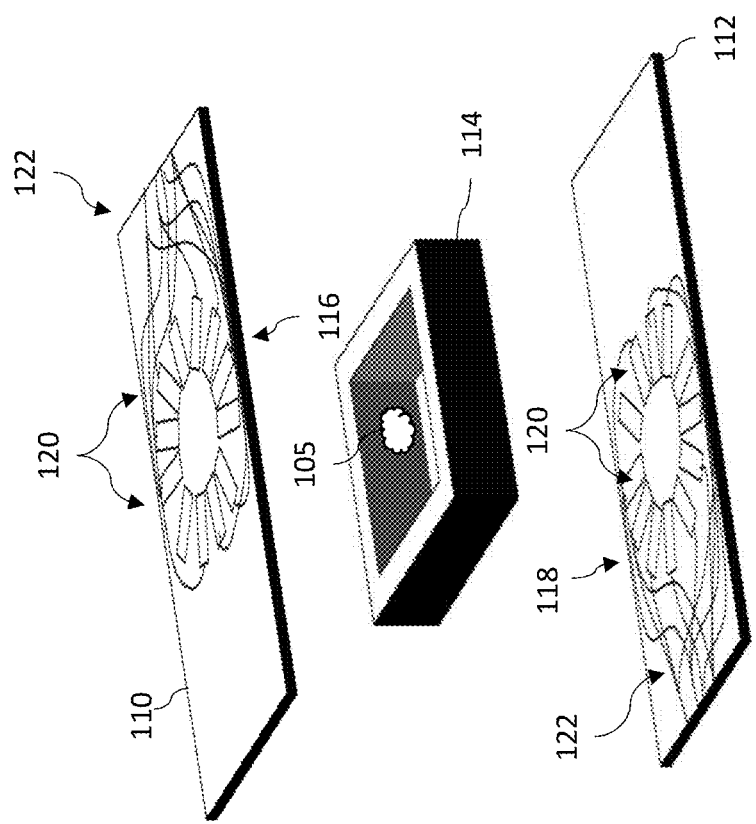

SYSTEMS AND METHODS FOR AN INTEGRATED OPTICAL ATOMIC SENSOR

BACKGROUND

Optical atomic sensors in the art today leverage atomic transitions that occur in a collection of laser cooled atoms in order to realize instruments such as inertial sensors to sense and measure inertial forces, or instruments such as clocks to measure the local passage of time. By operating using laser light in the optical range of frequencies, such sensors represent a substantial performance leap in terms of both precision and accuracy with the potential to provide corresponding benefits in navigation, communications, or other devices in which they are utilized. However, there are obstacles in the way of utilizing such sensors to their full potential and challenges in mass production. For example, optical atomic sensors require many laser beams to precisely intersect one another inside an ultra-high vacuum chamber containing an atomic vapor. The laser beam's parameters, such as the Gaussian parameters (waist position and divergence angle) and polarization need to be precisely matched between many different beams. Currently these alignments and parameters are achieved in laboratory settings using bulk optical components (for example, lenses, mirrors, polarizers, other free space optical elements, and the like) which are relatively large in size and require tedious and time-consuming alignment of each component of the system. As such, challenges remain in adapting and scaling these sensors for utilization in compact mass-produced devices.

For the reasons stated above and for other reasons stated below which will become apparent to those skilled in the art upon reading and understanding the specification, there is a need in the art for systems and methods for an integrated optical atomic sensor.

SUMMARY

The Embodiments of the present disclosure provide methods and systems for an integrated optical atomic sensor and will be understood by reading and studying the following specification.

In one embodiment, an optical atomic sensor comprises: a first photonic integrated circuit; a second photonic integrated circuit; and an atom trapping chamber positioned between and bonded to the first photonic integrated circuit and the second photonic integrated circuits with the first photonic integrated circuit and the second photonic integrated circuits aligned parallel to each other; and a sample of atomic vapor sealed within the atom trapping chamber; wherein the first photonic integrated circuit and second photonic integrated circuit each comprise: a plurality of grating emitters fabricated into respective surfaces of the first and second photonic integrated circuits; a system of waveguides configured to couple laser light from one or more laser light sources to the plurality of grating emitters; wherein at least one set of the plurality of grating emitters are arranged to launch laser light beams into the atom trapping chamber in a pattern structured to cool the atomic vapor and produce at least one atom trap inside the chamber; wherein the plurality of grating emitters further include at least one grating emitter configured to emit a laser light probe into the atomic vapor.

DRAWINGS

Embodiments of the present disclosure can be more easily understood and further advantages and uses thereof more readily apparent, when considered in view of the description of the preferred embodiments and the following figures in which:

FIGS. 1 and 1A are diagrams of an optical atomic sensor of one embodiment of the present disclosure;

In accordance with common practice, the various described features are not drawn to scale but are drawn to emphasize features relevant to the present disclosure. Reference characters denote like elements throughout figures and text.

DETAILED DESCRIPTION

Figure 2:
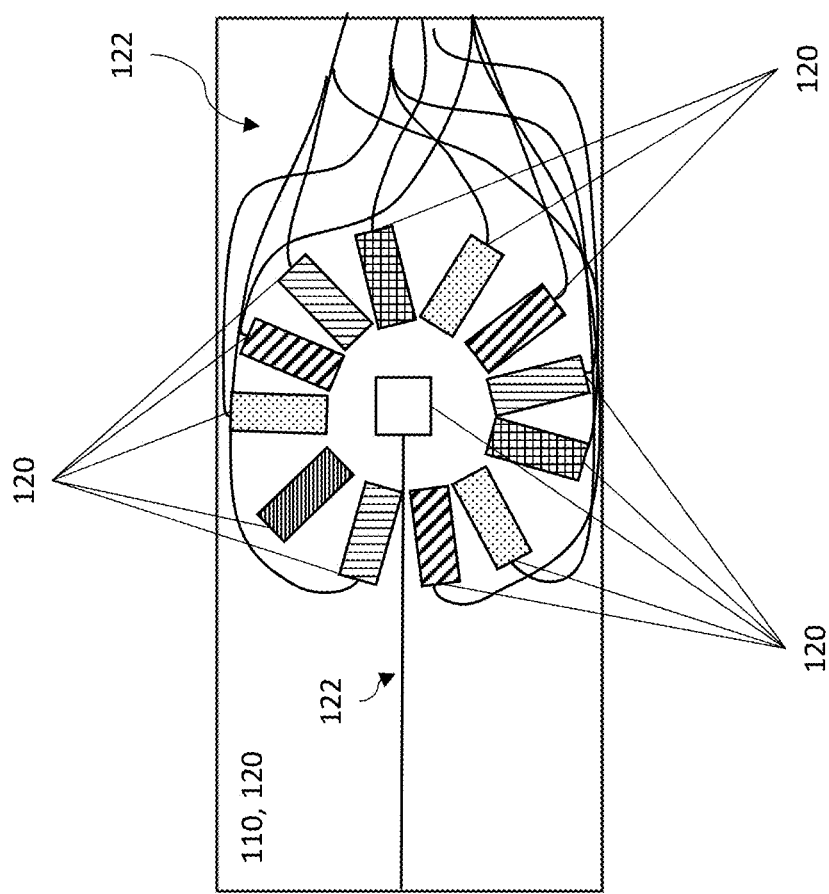
FIG. 2 is a diagram illustrating an example arrangement of grating emitters 120 and waveguides on a photonic integrated circuit an optical atomic sensor.

In the following detailed description, reference is made to the accompanying drawings that form a part hereof, and in which is shown by way of specific illustrative embodiments in which the embodiments may be practiced. These embodiments are described in sufficient detail to enable those skilled in the art to practice the embodiments, and it is to be understood that other embodiments may be utilized and that logical, mechanical and electrical changes may be made without departing from the scope of the present disclosure. The following detailed description is, therefore, not to be taken in a limiting sense.

Embodiments of the present disclosure provide for compact optical atom sensors that utilize multiple grating emitters integrated into photonic integrated circuits (PICs). The grating emitters launch multiple laser beams into a free space vacuum chamber where the beams are precisely aligned by the structure and arrangement of the grating emitters on the photonic integrated circuits. The resulting sensors are robust, small, and easy to manufacture because the grating emitters have their optical parameters, such as beam polarization, divergence, and pointing fixed by their fabrication. As further discussed below, the embodiments described herein further provide for sensors that can produce a dipole trap that comprises two accurately overlapping atomic traps within the vacuum chamber.

FIG. 1 is a diagram illustrating an optical atomic sensor 100 of one embodiment of the present disclosure. As shown in FIG. 1, the optical atomic sensor comprises a first photonic integrated circuit 110 and a second photonic integrated circuit 112 aligned parallel to each other, and an atom trapping chamber 114 positioned between the first and second photonic integrated circuits 110, 112. FIG. 1A is a partially exploded view of the optical atomic sensor 100 where the first photonic integrated circuit 110 is pulled away to reveal the inside of the atom trapping chamber 114. In some embodiments, a portion of the lower surface first photonic integrated circuit 110 defines a first wall 116 exposed to the inside of the atom trapping chamber 114 while a portion of the upper surface of the second photonic integrated circuit 112 defines an opposing second wall 118 exposed to the inside of the atom trapping chamber 114. The atom trapping chamber 114 may be secured to first and second photonic integrated circuits 110, 112 by a bonding material.

The atom trapping chamber 114 comprises an ultra-high vacuum chamber containing an atomic vapor. In operation, the atomic vapor is laser cooled by lasers emitted from the first and second photonic integrated circuits 110, 112 (as further discussed below) to form a sample of laser cooled atoms 105 at the center of the atom trapping chamber 114. The particular atoms 105 selected for loading into the chamber 114 would be based on the specific parameters the resulting sensor is intended to sense. This selection may be readily determined by one of ordinary skill in the art who has studied this disclosure. In alternate embodiments, the atomic vapor may comprise atoms such as, but not limited to, cesium, strontium, ytterbium or rubidium, for example. In general, any sample of atoms 105 that are known to those in the art as having cycling transition states and can be trapped and cooled by applying a combination of lasers and magnetic field may be utilized within the chamber 114.

With embodiments of the present disclosure, the first and second photonic integrated circuits 110, 112 each comprise a plurality of grating emitters 120 that emit laser light into the atom trapping chamber 114, such as the example pattern of grating emitters 120 shown in FIG. 2. In particular, a first pattern of grating emitters 120 is arranged on a surface of the first photonic integrated circuits 110 that defines the first wall 116, and a coordinated second pattern of grating emitters 120 is arranged on the a surface of the second photonic integrated circuits 110 that defines the second wall 118 in order to launch laser light into the atom trapping chamber 114 from opposing directions. With embodiments of the present disclosure, these grating emitters 120 on the first and second photonic integrated circuits 110, 112 deliver all the laser light needed to implement collecting, cooling, and trapping the atomic vapor to form a sample of laser cooled atoms 105 at the center of the atom trapping chamber 114, and for probing the states of the laser cooled atom sample in order to derive sensor measurements. In some embodiments, the grating emitters 120 are lithographically patterned diffraction gratings fabricated into the surfaces of the first and second photonic integrated circuits 110, 112. In some embodiments, the grating emitters 120 are lithographically patterned onto one or more thin film material layers on the first and second photonic integrated circuits 110, 112, such as a silicon nitride thin film layer. The grating emitters 120 may be arranged patterns on the first and second photonic integrated circuits 110, 112 so as to produce at least one atom trap inside the chamber 114, but may also be utilized to produce a plurality of overlapping atom traps of different types inside the chamber 114.

Laser light is delivered to the grating emitters 120 via a system of waveguide circuits 122 fabricated within each of the first and second photonic integrated circuits 110, 112. As such, the grating emitters 120 may each be considered as form of passive optical mode converter that converts light beams from a waveguide mode to free space travelling mode. The laser beams are directed from the waveguides 122 into free space by the grating emitters 120 with a defined direction, gaussian waist parameters, and polarization, for critical proper functioning of the sensor 100. As opposed to these parameters being implemented using bulk optic, they are instead established by the lithographic patterns which make up the waveguides 122 and grating emitters 120. Thus, during mass-production they are highly reproducible from part to part.

Figure 3:
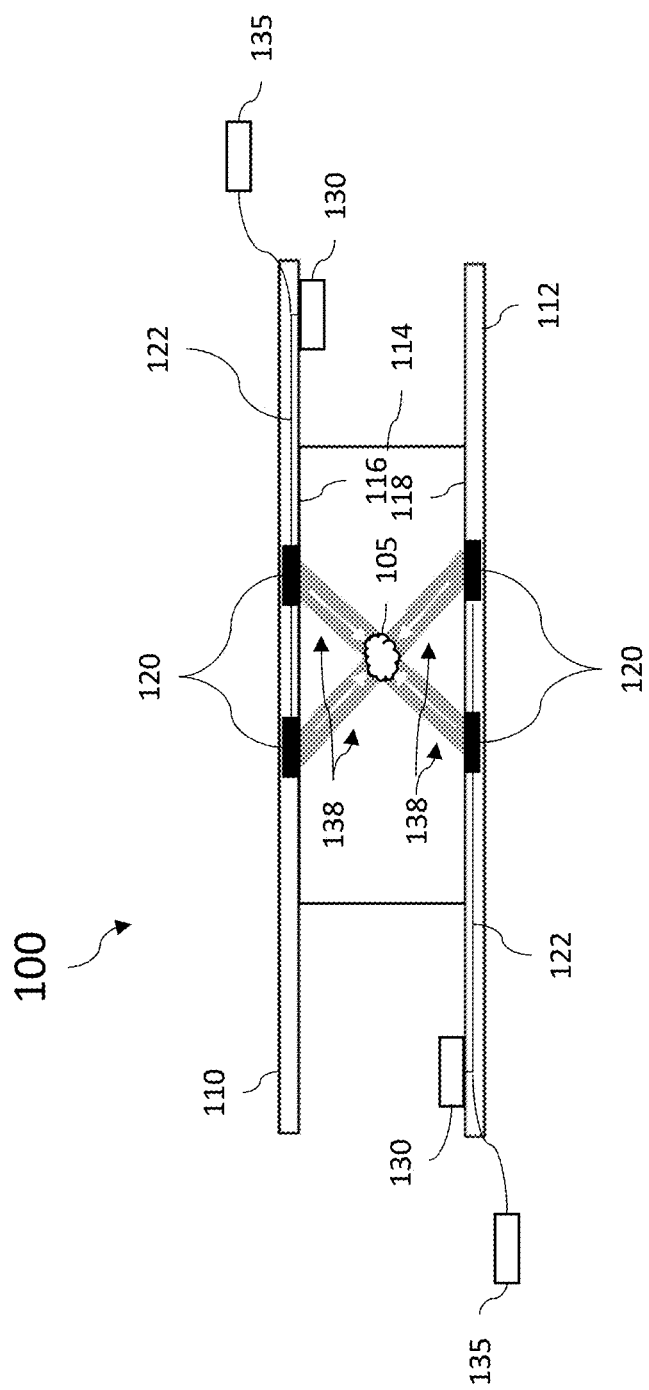
FIG. 3 is a diagram illustrating a combination of laser light sources with an optical atomic sensor of one embodiment of the present disclosure.

As shown in FIG. 3, in some embodiments, the one or more laser light sources 130 that generate the laser light carried by the waveguides 122 to the grating emitters 120 may be fabricated on-chip. That is, the laser light sources 130 may be laser devices fabricated into or onto the first and second photonic integrated circuits 110, 112 and directly feed laser light into the waveguides 122 that feed the grating emitters 120. In another embodiment, the laser light sources 130 may be off-chip laser devices (as shown at 135) and their laser light output is coupled into the waveguides 122 of the first and second photonic integrated circuits 110, 112. Depending on the particular application and selection of atoms 105, the particular wavelengths, and the number of different wavelengths, of laser light emitted into the chamber 114 (shown at 138) will vary. As such the number of laser light sources 130 and the wavelengths they emit are selected accordingly. For example, for cooling and trapping of the atom sample 105, the laser light wavelengths generated by the laser sources 130 may match transition frequency characteristics of the particular atoms in the atom sample that need to be cooled. For the purpose of probing, in some embodiments at least one laser light wavelength generated by the laser sources 130 may be adjustable to approximately match an energy gap of the atoms in the atom sample. It should be understood that the parameters of wavelength and frequency for laser light beams are by definition inversely proportional parameters for characterizing the color of that light beam.

Figure 4:
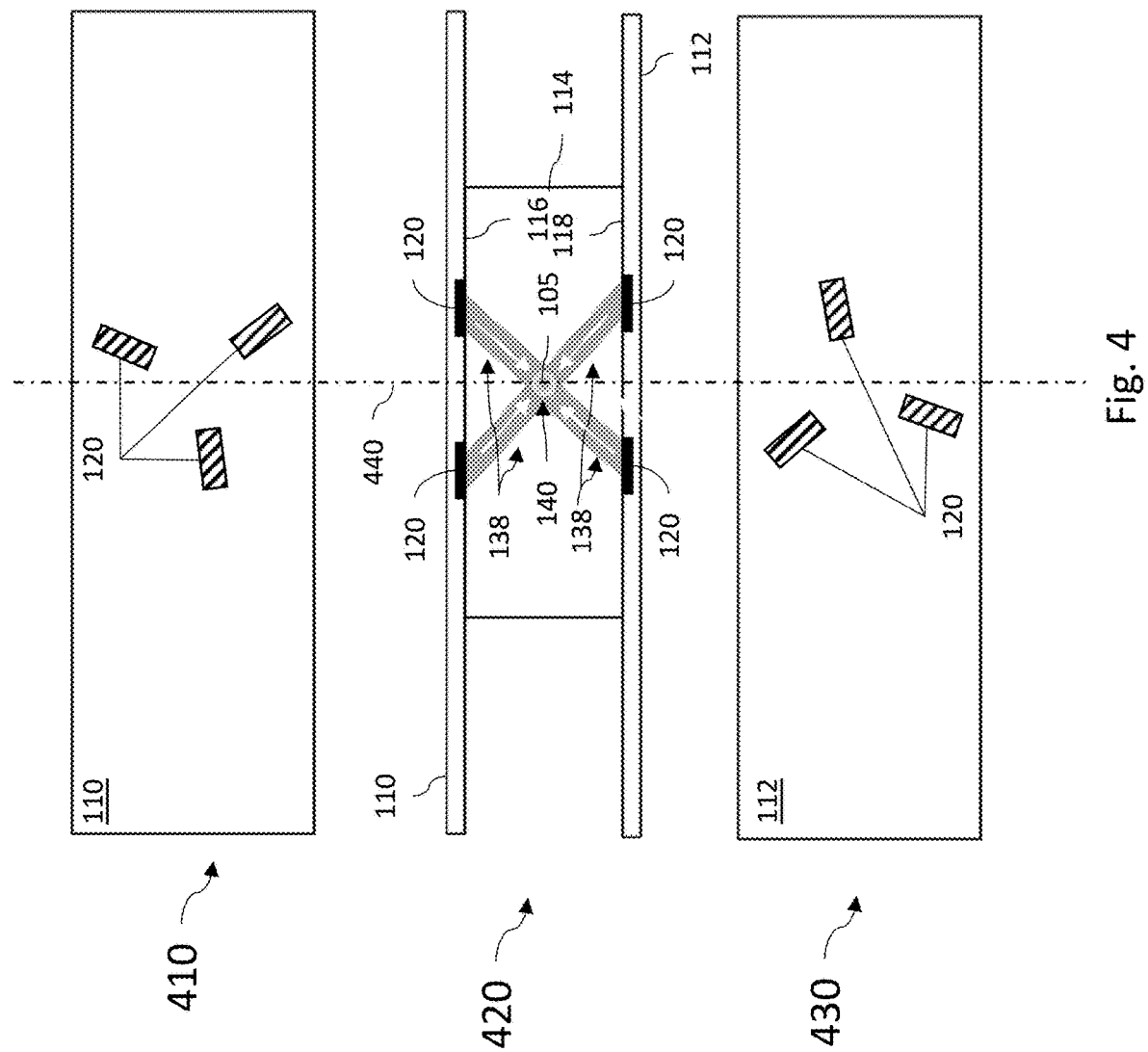
FIG. 4 is a diagram illustrating an example of an implementation of atom trap for an optical atomic sensor of one embodiment of the present disclosure.

FIG. 4 is a diagram illustrating an example embodiment of sensor 100 generating one form of an atom trap 140 holding the atom sample 105. In this embodiment, the grating emitters 120 are arranged in a coordinated pattern of three emitters on each of the first and second photonic integrated circuits 110, 112 as shown generally at 410 and 430. In this embodiment, for each grating emitter 120 used for atom trapping on one of the photonic integrated circuits, there is a complementary grating emitter 120 on the other photonic integrated circuit arranged such that they direct laser light beams 138 directly at each other. These two grating emitters 120, which may be referred to herein together as a set of "trapping emitter pairs" are arranged to aim the light they emit directly at each other and such that their respective laser light beams both pass through the center of the trapped cloud of atom vapor 105. In this embodiment, the atom trap 140 is implemented using sets of the trapping emitter pairs arranged to produce mutually orthogonal laser light beams 138. For example, the grating emitters 120 for the three sets of trapping emitter pairs may be arranged in a pattern such as a circle of uniform radius centered on the axis 440 which passes through the position of the trapped atom cloud along the edges of a hypothetical cube commonly referred to as the "[111]" configuration. For example, for a chamber 114 where these sides 116, 118 from where the laser light is emitted are a distance from each other equal to the diameter of the circle pattern of trapping emitter pairs, a launch angle of 54.7 degrees would result in each of the six laser beams intersecting at the center of the trapped atomic sample in an orthogonal configuration. In some embodiments as discussed below, another form of atom trap 140 (such as traps referred to as an optical dipole, or optical dipole lattice trap) may be formed by a single set of trapping emitter pairs that are each fabricated to launch light beams into the chamber 114 at angles of 90 degrees with respect the plane of their respective photonic integrated circuits 110, 112.

As mentioned above, in some embodiments, atom cooling and trapping within the chamber may be implemented using multiple laser beams of different wavelengths. The different wavelengths may be selected to align with different atomic transition levels of the atomic vapor, or for other reasons such as to produce multiple traps 140 within the chamber 114. In some embodiments that utilize multiple laser light wavelengths, the same grating emitters 120 may be utilized to emit light at each of the different wavelengths. By tailoring the parameters of the grating emitters 120, such as the period, spacing, and duty cycle of the patterned features that make up the grating emitters 120, laser beams with different wavelengths can be emitted at the same angle relative to the planes of their respective photonic integrated circuits 110, 112. For example, by designing the grating emitters 120 to be fed by waveguides 122 from non-parallel directions on the photonic integrated circuits 110, 112, and by tailoring the shape of the patterned features that make up the grating emitters 120, two different wavelengths of laser light 138 can be made to emit from the same grating emitter 120 at the same angular direction. Such a grating emitter may be referred to as a "free space wavelength multiplexer grating emitter", which is an advancement over a single wavelength emitter, in that fewer emitters need be fabricated onto the photonic integrated circuits. The plurality of beams emitted by one emitter are overlapped and co-propagating, with no angle between them. Such a configuration is advantageous for some kinds of atom sensors such as clocks and gyroscopes.

In some embodiments, instead of multiple wavelengths of laser light being aimed at the trap 140 from the same direction, it may be desirable to emit different wavelengths of light into the atom sample 105 from different directions. As such, in some embodiments, additional instances of set of trapping emitter pairs may be formed using additional grating emitters 120. For example, multiple sets of three trapping emitter pairs of the type shown in FIG. 4 may be used to project multiple instances of mutually orthogonal sets of laser light beams.

Many cold atom sensors utilize two or more overlapping atom traps to function. For example, to produce a cold atom sensor 100 for operation as one particular type of laser cooled strontium optical lattice clock, another type of atom trap 140 in which a so-called two stage magneto-optical-trap ("MOT") 140 is implemented. In such a device, 12 laser beams 138 from 12 grating emitters 120 intersect at right angles at the atom sample 105 to produce two overlapping MOTS. Importantly, these overlapping traps may be formed by laser beams with vastly different wavelengths (such as 461 nm and 689 nm, for example). Whether using single wavelength emitters, or double wavelength emitters, by arranging the grating emitters 120 in a pattern (such as the circle of uniform radius centered on the axis which passes through the position of the trapped atom cloud along the edges of the [111] cube configuration, for example) one or more MOTS can be made at the same position in the chamber 114.

Furthermore, in some embodiments, by tailoring the shape, size, and spacing of the lithographically patterned features in the grating emitters 120, the emitted laser light beams 138 can be made to diverge, converge, or travel in a collimated fashion. For example, 6 beams emitted from 6 grating emitters 120 (e.g., arranged as two instances of three trapping emitter pairs) can each be a collimated beam of 4 mm radius; 6 other beams may be of 2 mm radius, but all 12 beams intersect in the same region. This would be highly challenging using bulk optics, as each beam would need to pass through a different bulk optic(s), and those optics may occupy a substantial volume and may also interfere with one another when positioned near the chamber 114. It should be understood that the photonic integrated circuits 110, 112 may comprise additional grating emitters 120 that can emit other beams at any desirable angle that does not interfere with the trapping laser beams (for example, not along the [111] angles) and can be located at other convenient places on the photonic integrated circuits 110, 112. Additional grating emitters 120 need not be arranged as emitter pairs, and may implement other functions such as launching repumping beams or probe beams which may be used for cold atom sensors.

In some embodiments, each grating emitter 120 may be fed with a waveguide or waveguides 122 carrying a potentially different wavelength or wavelengths from the other grating emitters 120. In this way, many large or small beams, of a variety of wavelengths and gaussian beam parameters, can all be directed and focused into the atom trapping chamber 114 and focused into the atom sample 105 without bulk mirrors or lenses. This makes pointing and focusing of the sensor 100 robust against shock, vibration, or thermal excursion which can cause bulk elements to move out of position.

In some embodiments that implement an atom trap 140 configuration as described in FIG. 4, each of the emitted beams used for cooling and trapping are circularly polarized. This polarization can be achieved by tailoring the structures which make up the grating emitters 120 (and/or the waveguides 120 that feed those emitters 120) to produce linear, elliptical, or circular polarization, and can be done so for any emitted wavelength. In this way, the many beams used in the atom trap 140 can have tailored polarization without using bulk waveplates or retarders. This also makes the polarization robust against shock, vibration, or thermal excursions which can cause bulk elements to change their polarizing properties.

Figure 5:
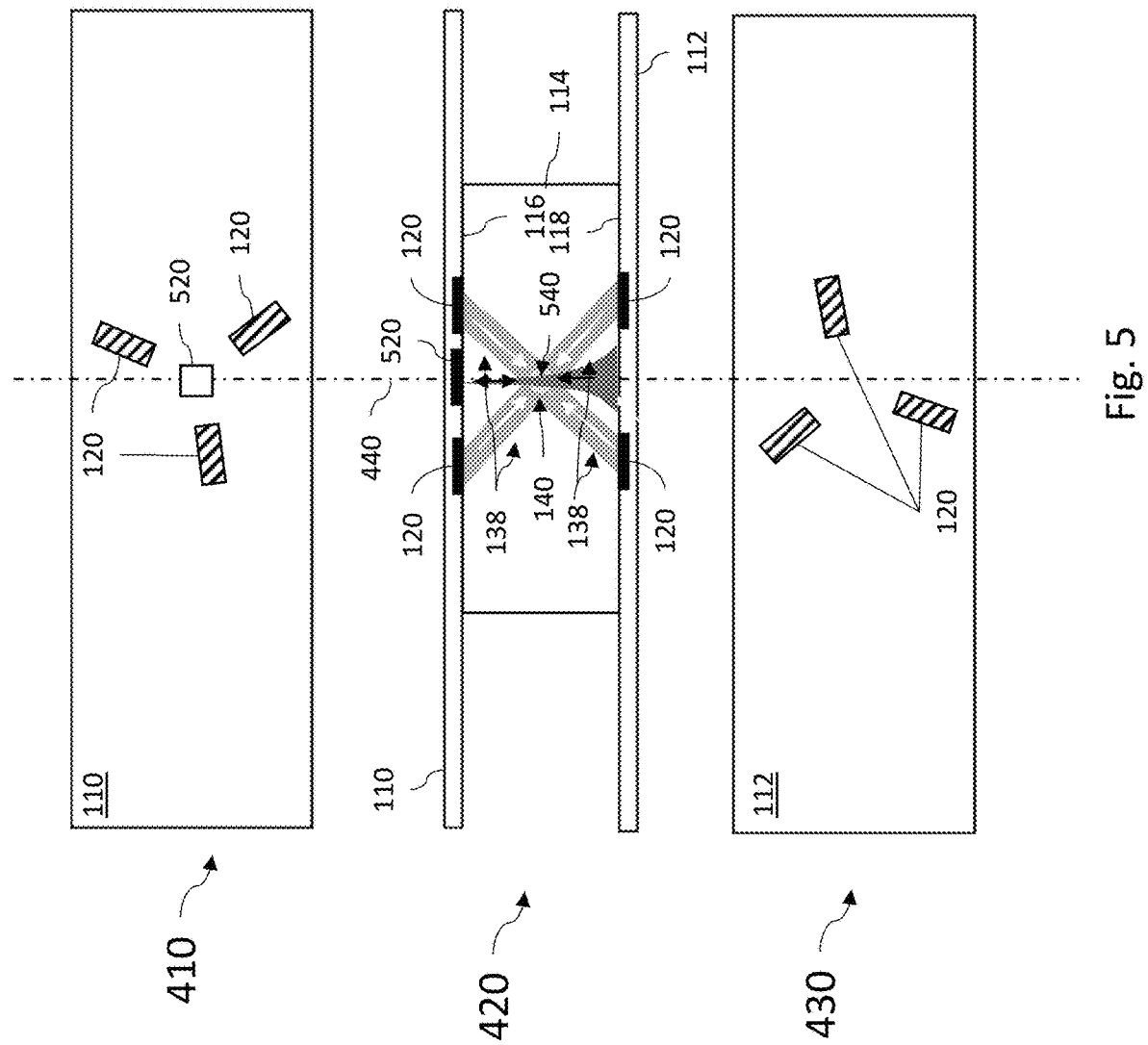
FIG. 5 is a diagram illustrating an example of an implementation of multiple overlaying atom traps for an optical atomic sensor of one embodiment of the present disclosure.

In some embodiments, the sensor 100 may be used to implement a third, different kind of trap, that is overlapped with one or more atom traps 140 within the atom tapping chamber 114. One example of such an implementation would be for a strontium optical lattice clock. For example, in one embodiment such as shown in FIG. 5, either a one-dimensional or three-dimensional optical dipole lattice trap 540 overlaps with a three orthogonal axis atom trap 140 (such as shown in FIG. 4), within the atom tapping chamber 114. The optical dipole lattice trap 540 is produced by a grating emitter 120 (shown at 520 in FIG. 5) that is structured to emit a laser light beam from the first photonic integrated circuit 110 into the chamber 114 to produce a beam 148 that exhibits a gaussian waist at the surface 118 of the second photonic integrated circuit 112 that is in a hemispherical resonator spatial optical mode with interference fringes in the three orthogonal axis atom trap 140. For some embodiments that implement the optical dipole lattice trap, the probe beam (which has a different wavelength of laser light than the beam(s) forming the optical dipole lattice trap 540) can be emitted from a grating emitter 120 that is located at the waist of the lattice (dipole) beam on the photonic integrated circuit 110. The grating emitter 120 may comprise an optical coating that reflects at the wavelength of the lattice (dipole) laser beam, but transmits at the wavelength of the probe beam such that the probe beam propagates along the axis of the lattice (dipole) trap, probing the trapped atoms.

Figure 6:
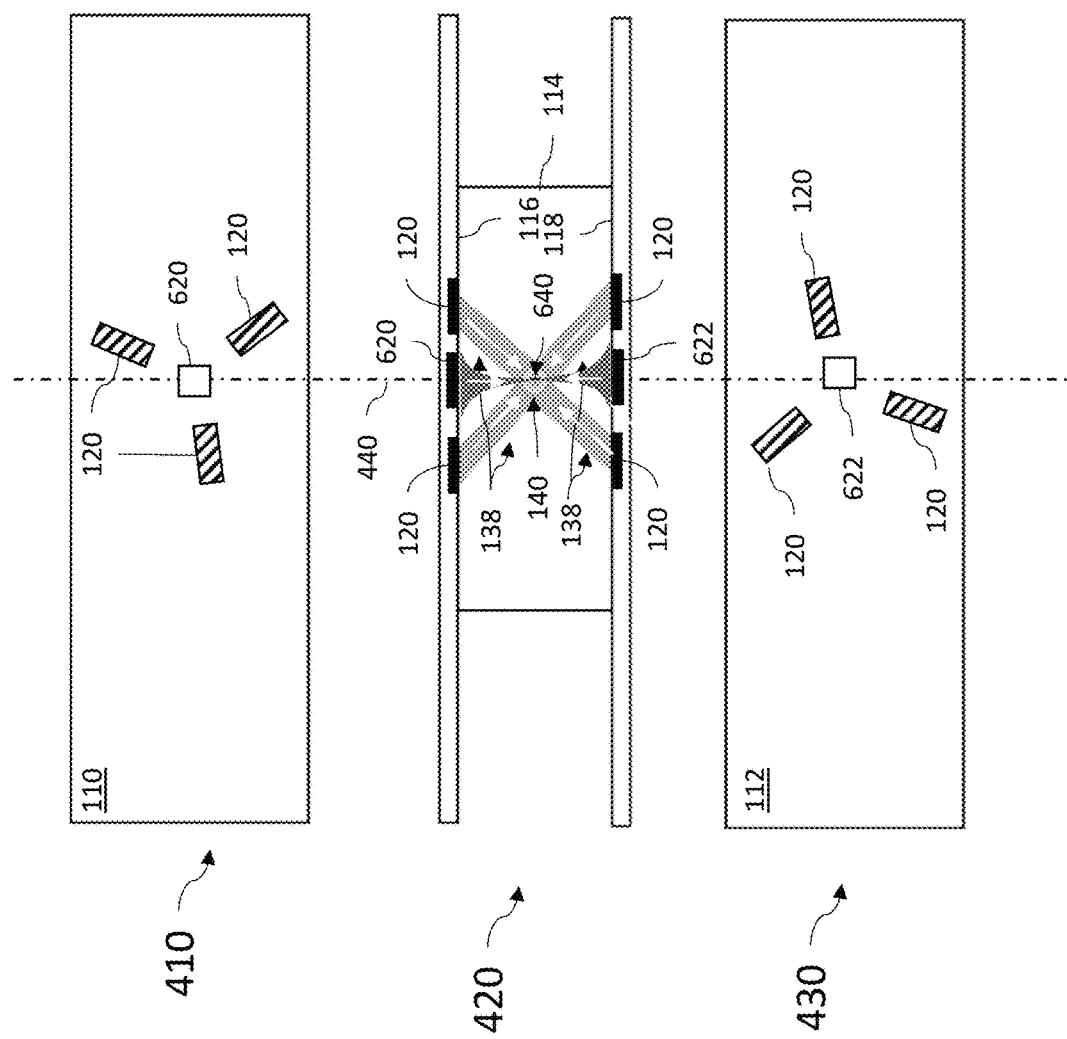
FIG. 6 is a diagram illustrating an example of another implementation of multiple overlaying atom traps for an optical atomic sensor of one embodiment of the present disclosure.

In one variation of an optical dipole embodiment, shown in FIG. 6, two laser light beams are emitted, one from a grating emitter 120 of the first photonic integrated circuit 110 (Shown at 620 in FIG. 6) and one from a grating emitter 120 of the second photonic integrated circuit 112 (Shown at 622 in FIG. 6). Each of these two grating emitters 620, 622 is structured to emit a laser light beam that beam exhibits a gaussian waist at the location of the three orthogonal axis atom trap 140, in a confocal resonator spatial optical mode with interference fringes in the three orthogonal axis atom trap 140. In some embodiments, the two grating emitters 620, 622 may be considered to form a single set of trapping emitter pairs (such as previously described above) that are each fabricated to launch light beams into the chamber 114 at angles of 90 degrees (or other set of supplementary angles) with respect the plane of their respective photonic integrated circuits 110, 112. With the three orthogonal axis atom trap 140 and optical dipole lattice trap 640 formed in this way, overlap is guaranteed by virtue of the arrangement and design of the multiple grating emitters 120 on the photonic integrated circuits 110, 112. As such, this configuration allows the various traps to remain well aligned, so that the atomic sensor 100 performance is optimal.

Figure 7:
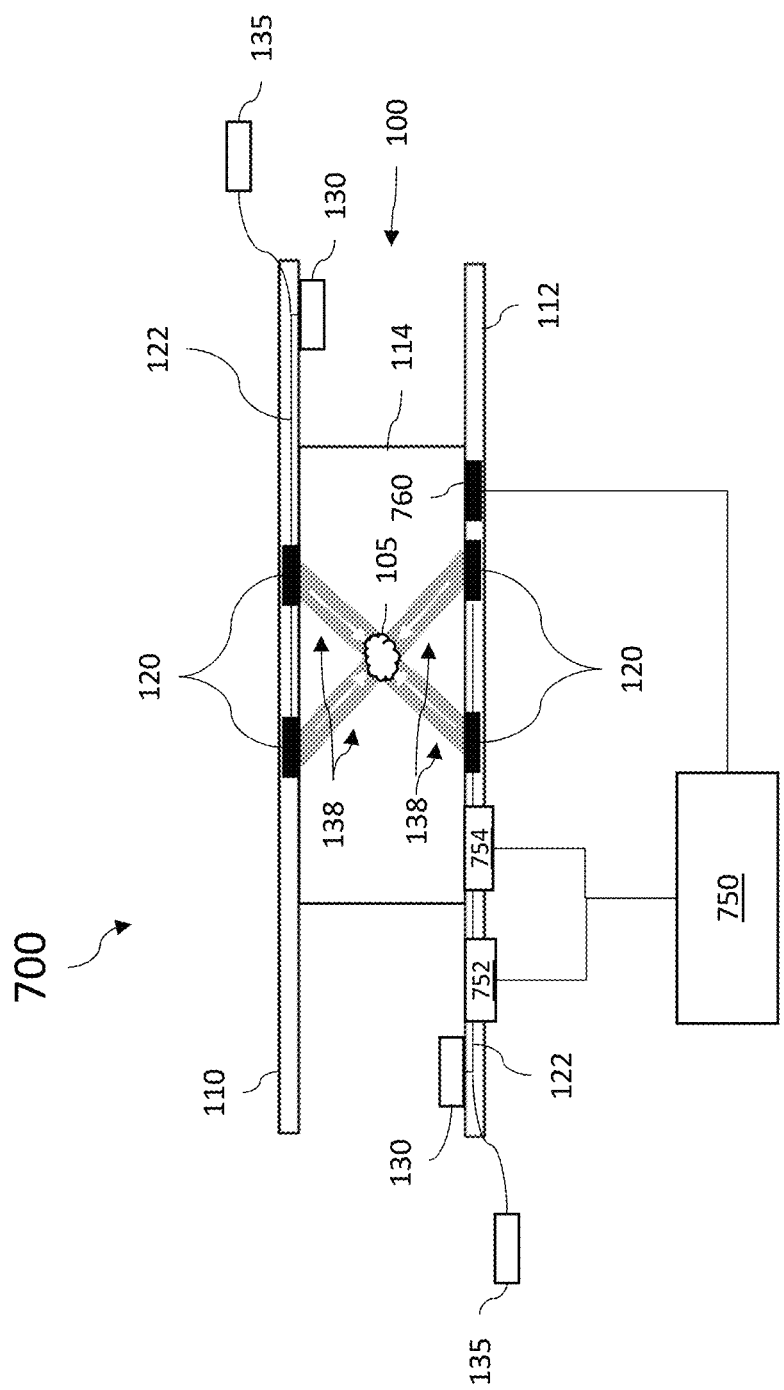
FIG. 7 is a diagram illustrating an example system embodiment with control, light source, and detection components in combination with an optical atomic sensor of one embodiment of the present disclosure.

As illustrated by the system 700 in FIG. 7, for any of the different embodiments and implementations disclosed herein, control of the light beams 138 emitted from the grating emitters 120 can be implemented in various ways. For example, in some embodiments the sensor 100 may include, or otherwise be coupled to, a control circuit 750 to control various aspects of the light beams 138 entering the chamber 114. For example, in some embodiments, the control circuit 150 may control operation of one or more of the laser light sources 130 or 135 in order cycle the light output on and off, or control the wavelength of light generated by the laser light sources 140. In some embodiments, the controller 750 may further operated optical control elements such as shutters 752 or modulators 754 (which in some embodiments may be fabricated into or on to the photonic integrated circuits 110, 112). By controlling of the laser light beams entering the chamber 114, the controller 750 may cycle the trapped atoms through atomic transitions and cycle the sensor 100 between trapping and probing states. In some embodiments, the controller 750 may cycle the laser light beams so that beams of different wavelengths are emitted into the chamber 114 at different times.

In some embodiments, the sensor 100 cycles between trapping and probing modes under control of the controller 750. It is during probing that characteristics of the atomic sample are measured by emitting a laser light beam from a grating emitter 120. As such, in some embodiments, the sensor 100 may further comprise at least one optical detector 760 (which in some embodiments may be fabricated into or on to the photonic integrated circuits 110, 112) to capture measurements or images from within the chamber 114. The output of the optical detector 760 may then be provided back to the controller 750 or other device for processing.

For example, to implement a clock from the sensor 100, in one embodiment the frequency of the laser light beam used for probing is adjusted by the controller 750 to match the corresponding energy gap of the atoms that make up the atom cloud 105. The energy gap has an invariant frequency associated with it that is proportion to the energy of the gap of the atoms. The laser beam is directed by a grating emitter 120 through the atom cloud 105 and measured on the other side (for example, by optical detector 760) and used to servo control the light source 130,135 producing the laser beam. When the frequency of the laser light is adjusted so that it matches the frequency of the atoms' energy gap, a minimum in the amount of light passing thought the cloud 105 will be observed due to absorption of a percentage of the light by the atom cloud. The frequency of the laser light may then be used for the purpose of accurately measuring time.

For implementing inertial sensors, such as accelerometers or gyroscopes, the operation of the sensor 100 is substantially similar. The difference would be what characteristic or state of the atom cloud 105 is measured by the probing laser beam while the trapping laser beams are cycled off. For example, for an accelerometer, once the trap 140 is turned off, the atoms will shift in position as they "fall" or become displaced within the chamber 114 due to linear acceleration of the sensor 100. The probing laser beam passes through the atom cloud 105 and detector 760 reads an atomic fringe or interferometric pattern to characterize motion of the atoms based on their quantum properties. For a gyroscope sensor that measures axial rotation, 6 orthogonal laser beams are emitted from the grating emitters 120 into the chamber 114. The atoms of atom cloud 105 are typically alkali atoms for such an embodiment and may comprise rubidium or cesium atoms. In one embodiment, the laser cooling cools the atoms of cloud 105 down to a temperature of approximately 1 micro-Kelvin. Once cooled, the cold atom cloud 105 is released into an optical lattice and subjected to optical pulses from the grating emitters 120 to form an inertial sensor. After the atom cloud 105 is cooled, interfering laser beams of offsetting frequency are applied into the chamber 114. Where the resulting laser intensity is highest, the optical lattice creates an energy/potential well for the atoms. By slightly detuning the relative frequency difference of the two interfering laser beams to form that optical lattice, the lattice to begins to move and the atoms trapped in various antinodes of the lattice potential will begin to accelerate with it. In operating the optical lattice, a plane is selected in which to create the interferometer split wave-function paths, and that plane will be perpendicular to the rotation axis along which rotation sensing is desired. Two wave function paths will reach a point of recombination and the recombined beams may be probed using a laser beam from a grating emitter 120, and read out by detector 760 to obtain an atomic phase measurement that will represent a component of rotation with respect to an axis normal to the plane if the interferometer split wave-function paths. Further details regarding implementation of such an atomic gyroscope may be found in U.S. patent application Ser. No. 15/418,990, filed on Jan. 1, 2017 and titled "FULLY RECIPROCAL ATOMIC INTERFEROMETRIC GYROSCOPES, which is incorporated herein by reference in its entirety.

In addition to the operational advantages described above, the structure of sensor 100 contributed to efficiencies in device fabrication. For example, in one embodiment of a fabrication process alignment of the photonic integrated circuits 110, 112 may be achieved by emitting light beams from grating emitters 120 on one of the photonic integrated circuits and measuring the power of light beam received at corresponding grating emitters 120 on the other of the photonic integrated circuits. For example, the photonic integrated circuit 110 may be held by a pick-and-place positioner while the photonic integrated circuit 120 is held in a manifold of an optical detector. When an optical power intensity maximum is detected, the two photonic integrated circuits 110, 112 are aligned and may be cemented in place to the walls of the chamber 114. In one embodiment, the two photonic integrated circuits 110, 112 (which may be of different design) are registered relative to one another in an alignment procedure. The photonic integrated circuits 110, 112 are situated on either side of the chamber 114. Alignment of the two photonic integrated circuits 110, 112 is achieved by maximizing the coupling of light from the grating emitter 120 on photonic integrated circuits 110 into the grating emitters 120 photonic integrated circuits 112 (which are now acting as "receivers"). By adjusting the x,y,z position, and pitch, roll, and yaw angles, of each of the photonic integrated circuits 110, 112, the amount light coupled from the one emitter emitting light into its paired emitter on the other photonic integrated circuits receiving light can be maximized. By the symmetric arrangement of grating emitters 120 on each photonic integrated circuit 110, 112 this guarantees that the intersection region of the a [1,1,1] MOT 140 or other MOTs 140 is properly formed, without needing to examine the hardware to measure quantities of the beam parameters, but rather only the easily measurable quantities of in-coupled power. In some embodiments, cross coupled power may be maximized both ways. In this way the alignment can be done with real time feedback during manufacture. Once the coupling is determined to be maximal, the photonic integrated circuits 110, 112 are permanently bonded to the opposing sides of the chamber 114 (for example, via optical contacting to the glass walls of the vacuum cell, or to a hollow spacer into which the vacuum cell can be inserted). The region of beam overlap of the MOT beams emitted from both photonic integrated circuit 110, 112 is thus defined with no need for adjustable bulk optics. This results in an optical atomic sensor 100 in which the optics system can be first optimized for performance, then locked down to make the sensor robust.

Example Embodiments

Example 1 includes an optical atomic sensor, the sensor comprising: a first photonic integrated circuit; a second photonic integrated circuit; and an atom trapping chamber positioned between and bonded to the first photonic integrated circuit and the second photonic integrated circuit with the first photonic integrated circuit and the second photonic integrated circuits aligned parallel to each other; and a sample of atomic vapor sealed within the atom trapping chamber; wherein the first photonic integrated circuit and second photonic integrated circuit each comprise: a plurality of grating emitters fabricated into respective surfaces of the first and second photonic integrated circuits; a system of waveguides configured to couple laser light from one or more laser light sources to the plurality of grating emitters; wherein at least one set of the plurality of grating emitters are arranged to launch laser light beams into the atom trapping chamber in a pattern structured to cool the atomic vapor and produce at least one atom trap inside the chamber; wherein the plurality of grating emitters further include at least one grating emitter configured to emit a laser light probe into the atomic vapor.

Example 2 includes the sensor of example 1, wherein the laser light beams are directed from the system of waveguides into free space within the atom trapping chamber at an angle defined by a structure of individual grating emitters.

Example 3 includes the sensor of example 2, wherein one or both of the system of waveguides and the individual grating emitters are configured to control either gaussian waist parameters or polarization of the laser light beams.

Example 4 includes the sensor of any of examples 1-3 wherein at least one of the one or more laser light sources are devices fabricated into either the first photonic integrated circuit or the second photonic integrated circuit.

Example 5 includes the sensor of any of examples 1-4, wherein the atom trapping chamber comprises an ultra-high vacuum chamber.

Example 6 includes the system of any of examples 1-5, wherein the atomic vapor comprises atoms having cycling transition states and characterized by the properties that they are coolable and trappable using laser light.

Example 7 includes the system of example 6, wherein the atomic vapor contains one of cesium, strontium, ytterbium, or rubidium.

Example 8 includes the sensor of any of examples 1-7, wherein for each of the plurality of grating emitters on the first photonic integrated circuit there is a complementary grating emitter of the plurality of grating emitters on the second photonic integrated circuit defining a set of trapping emitter pairs, wherein the set of trapping emitter pairs are arranged to aim respective laser light beams that they emit directly at each other and such that their respective laser light beams both pass through the center of the at least one atom trap.

Example 9 includes the sensor of any of examples 1-8, wherein the at least one atom trap inside the chamber comprises either a three orthogonal axis atom trap, an optical dipole lattice trap, or a combination of a three orthogonal axis atom trap and optical dipole lattice trap.

Example 10 includes the sensor of example 9, wherein the optical dipole lattice trap is generated by a first grating emitter structured to emit a laser light beam from the first photonic integrated circuit into the atom trapping chamber so that the laser light beam exhibits a gaussian waist at a surface of the second photonic integrated circuit, in a hemispherical resonator spatial optical mode with interference fringes in a magneto-optical-trap also formed within the atom trapping chamber.

Example 11 includes the sensor of any of examples 9-10, wherein the optical dipole lattice trap is generated by a first grating emitter on the first photonic integrated circuit and a second grating emitter from, the second photonic integrated circuit, wherein each of the first and second grating emitters is structured to emit a laser light beam that beam exhibits a gaussian waist at a location of a magneto-optical-trap also formed within the atom trapping chamber, in a confocal resonator spatial optical mode with interference fringes in the magneto-optical-trap.

Example 12 includes the sensor of any of examples 9-11, wherein the three orthogonal axis atom trap implemented in the atom trapping chamber using a first sets of three trapping emitter pairs that are arranged to launch mutually orthogonal sets of laser light beams, wherein each of trapping emitter pairs are arranged to aim respective laser light beams that they emit directly at each other and such that their respective laser light beams both pass through the center of the first atom trap.

Example 13 includes the sensor of any of examples 1-12, wherein a first set of the plurality of grating emitters transmits laser light beams of a first wavelength, and second set of the plurality of grating emitters transmits laser light beams of a second wavelength, wherein the first wavelength is different from the second wavelength; wherein the first set of the plurality of grating emitters and the second set of the plurality of grating emitters are structure to project the laser light beams of the first wavelength and the laser light beams of the second wavelength to intersect at a center of the at least one atom trap inside the chamber.

Example 14 includes the sensor of any of examples 1-13, wherein for a first set of the plurality of grating emitters, each of the grating emitters receives laser light of a first wavelength from the system of waveguides and laser light of a second wavelength from the system of waveguides, wherein the first wavelength is different from the second wavelength; wherein each of said first set of the plurality of grating emitters are structured to project the laser light beams of the first wavelength and the laser light beams of the second wavelength to intersect at a center of the at least one atom trap inside the chamber.

Example 15 includes an optical atomic sensor system, the sensor comprising: optical atomic sensor; at least one laser light source coupled to the optical atomic sensor; a control circuit coupled to the optical atomic sensor and the at least one laser light source; wherein the optical atomic sensor comprises: a first photonic integrated circuit; a second photonic integrated circuit; and an atom trapping chamber positioned between and bonded to the first photonic integrated circuit and the second photonic integrated circuits with the first photonic integrated circuit and the second photonic integrated circuits aligned parallel to each other; and a sample of atomic vapor sealed within the atom trapping chamber; wherein the first photonic integrated circuit and second photonic integrated circuit each comprise: a plurality of grating emitters fabricated into respective surfaces of the first and second photonic integrated circuits; a system of waveguides coupled to that at least one laser light source and configured to couple laser light to the plurality of grating emitters; wherein at least one set of the plurality of grating emitters are arranged to launch laser light beams into the atom trapping chamber in a pattern structured to cool the atomic vapor and produce at least one atom trap inside the chamber; wherein the plurality of grating emitters further include at least one grating emitter configured to emit a laser light probe into the atomic vapor.

Example 16 includes the system of example 15, wherein the control circuit controls at least one of: cycling of an output of the one or more laser light sources; or a wavelength of an output of the one or more laser light sources.

Example 17 includes the system of any of examples 15-16, wherein the optical atomic sensor further comprises: at least one optical shutter fabricated into either first photonic integrated circuit or the second photonic integrated circuit; or at least on optical modulator fabricated into either first photonic integrated circuit or the second photonic integrated circuit; wherein the control circuit controls operation of either the at least one optical shutter or the at least on optical modulator.

Example 18 includes the system of any of examples 15-17, wherein the optical atomic sensor further comprises at least one optical detector positioned to receive a probing laser light beam emitted by a first grating emitter of the plurality of grating emitters, wherein the probing laser light beam passes through the sample of atomic vapor; wherein the control circuit control the laser light beams in response to measurement signals from the at least one optical detector Example 19 includes the system of any of examples 15-18, wherein the laser light beams are directed from the system of waveguides into free space within the atom trapping chamber at an angle defined by a structure of individual grating emitters.

Example 20 includes the system of any of examples 15-19, wherein the at least one atom trap inside the chamber comprises either a three orthogonal axis atom trap, an optical dipole lattice trap, or a combination of at least one three orthogonal axis atom trap and an optical dipole lattice trap.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the presented embodiments. Therefore, it is manifestly intended that embodiments be limited only by the claims and the equivalents thereof.

What is claimed is:

1. An optical atomic sensor, the sensor comprising:
   a first photonic integrated circuit;
   a second photonic integrated circuit;
   an atom trapping chamber positioned between and bonded to the first photonic integrated circuit and the second photonic integrated circuit with the first photonic integrated circuit and the second photonic integrated circuits aligned parallel to each other; and
   a sample of atomic vapor sealed within the atom trapping chamber;
   wherein the first photonic integrated circuit and second photonic integrated circuit each comprise:
      a plurality of grating emitters fabricated into respective surfaces of the first and second photonic integrated circuits; and
      a system of waveguides configured to couple laser light from one or more laser light sources to the plurality of grating emitters;
   wherein at least one set of the plurality of grating emitters on each of the first photonic integrated circuit and the second photonic integrated circuit are arranged to launch laser light beams into the atom trapping chamber in a pattern structured to cool the atomic vapor and produce at least one atom trap inside the chamber; and
   wherein the plurality of grating emitters on both of the first photonic integrated circuit and the second photonic integrated circuit further include at least one grating emitter configured to emit a laser light probe into the atomic vapor.

2. The sensor of claim 1, wherein the laser light beams are directed from the system of waveguides into free space within the atom trapping chamber at an angle defined by a structure of individual grating emitters.

3. The sensor of claim 2, wherein one or both of the system of waveguides and the individual grating emitters are configured to control either gaussian waist parameters or polarization of the laser light beams.

4. The sensor of claim 1 wherein at least one of the one or more laser light sources are devices fabricated into either the first photonic integrated circuit or the second photonic integrated circuit.

5. The sensor of claim 1, wherein the atom trapping chamber comprises an ultra-high vacuum chamber.

6. The system of claim 1, wherein the atomic vapor comprises atoms having cycling transition states and characterized by the properties that they are coolable and trappable using laser light.

7. The system of claim 6, wherein the atomic vapor contains one of cesium, strontium, ytterbium, or rubidium.

8. The sensor of claim 1, wherein for each of the plurality of grating emitters on the first photonic integrated circuit there is a complementary grating emitter of the plurality of grating emitters on the second photonic integrated circuit defining a set of trapping emitter pairs, wherein the set of trapping emitter pairs are arranged to aim respective laser light beams that they emit directly at each other and such that their respective laser light beams both pass through the center of the at least one atom trap.

9. The sensor of claim 1, wherein the at least one atom trap inside the chamber comprises either a three orthogonal axis atom trap, an optical dipole lattice trap, or a combination of a three orthogonal axis atom trap and optical dipole lattice trap.

10. The sensor of claim 9, wherein the optical dipole lattice trap is generated by a first grating emitter structured to emit a laser light beam from the first photonic integrated circuit into the atom trapping chamber so that the laser light beam exhibits a gaussian waist at a surface of the second photonic integrated circuit, in a hemispherical resonator spatial optical mode with interference fringes in a magneto-optical-trap also formed within the atom trapping chamber.

11. The sensor of claim 9, wherein the optical dipole lattice trap is generated by a first grating emitter on the first photonic integrated circuit and a second grating emitter from, the second photonic integrated circuit, wherein each of the first and second grating emitters is structured to emit a laser light beam that beam exhibits a gaussian waist at a location of a magneto-optical-trap also formed within the atom trapping chamber, in a confocal resonator spatial optical mode with interference fringes in the magneto-optical-trap.

12. The sensor of claim 9, wherein the three orthogonal axis atom trap implemented in the atom trapping chamber using a first sets of three trapping emitter pairs that are arranged to launch mutually orthogonal sets of laser light beams, wherein each of trapping emitter pairs are arranged to aim respective laser light beams that they emit directly at each other and such that their respective laser light beams both pass through the center of the first atom trap.

13. The sensor of claim 1, wherein a first set of the plurality of grating emitters transmits laser light beams of a first wavelength, and second set of the plurality of grating emitters transmits laser light beams of a second wavelength, wherein the first wavelength is different from the second wavelength; and
   wherein the first set of the plurality of grating emitters and the second set of the plurality of grating emitters are structure to project the laser light beams of the first wavelength and the laser light beams of the second wavelength to intersect at a center of the at least one atom trap inside the chamber.

14. The sensor of claim 1, wherein for a first set of the plurality of grating emitters, each of the grating emitters receives laser light of a first wavelength from the system of waveguides and laser light of a second wavelength from the system of waveguides, wherein the first wavelength is different from the second wavelength; and
   wherein each of said first set of the plurality of grating emitters are structured to project the laser light beams of the first wavelength and the laser light beams of the second wavelength to intersect at a center of the at least one atom trap inside the chamber.

15. An optical atomic sensor system, the sensor comprising:
   optical atomic sensor;
   at least one laser light source coupled to the optical atomic sensor; and
   a control circuit coupled to the optical atomic sensor and the at least one laser light source;
   wherein the optical atomic sensor comprises:
      a first photonic integrated circuit;
      a second photonic integrated circuit;
      an atom trapping chamber positioned between and bonded to the first photonic integrated circuit and the second photonic integrated circuits with the first photonic integrated circuit and the second photonic integrated circuits aligned parallel to each other; and
      a sample of atomic vapor sealed within the atom trapping chamber;
   wherein the first photonic integrated circuit and second photonic integrated circuit each comprise:
      a plurality of grating emitters fabricated into respective surfaces of the first and second photonic integrated circuits; and
      a system of waveguides coupled to that at least one laser light source and configured to couple laser light to the plurality of grating emitters;
   wherein at least one set of the plurality of grating emitters on each of the first photonic integrated circuit and the second photonic integrated circuit are arranged to launch laser light beams into the atom trapping chamber in a pattern structured to cool the atomic vapor and produce at least one atom trap inside the chamber; and
   wherein the plurality of grating emitters on both of the first photonic integrated circuit and the second photonic integrated circuit further include at least one grating emitter configured to emit a laser light probe into the atomic vapor.

16. The system of claim 15, wherein the control circuit controls at least one of:
   cycling of an output of the one or more laser light sources; or
   a wavelength of an output of the one or more laser light sources.

17. The system of claim 15, wherein the optical atomic sensor further comprises:
   at least one optical shutter fabricated into either first photonic integrated circuit or the second photonic integrated circuit; or
   at least on optical modulator fabricated into either first photonic integrated circuit or the second photonic integrated circuit;
   wherein the control circuit controls operation of either the at least one optical shutter or the at least on optical modulator.

18. The system of claim 15, wherein the optical atomic sensor further comprises at least one optical detector positioned to receive a probing laser light beam emitted by a first grating emitter of the plurality of grating emitters, wherein the probing laser light beam passes through the sample of atomic vapor; and
   wherein the control circuit controls the laser light beams in response to measurement signals from the at least one optical a detector.

19. The system of claim 15, wherein the laser light beams are directed from the system of waveguides into free space within the atom trapping chamber at an angle defined by a structure of individual grating emitters.

20. The system of claim 15, wherein the at least one atom trap inside the chamber comprises either a three orthogonal axis atom trap, an optical dipole lattice trap, or a combination of at least one three orthogonal axis atom trap and an optical dipole lattice trap.

* * * * *